United States Patent
Wei et al.

(10) Patent No.: US 10,897,241 B2
(45) Date of Patent: Jan. 19, 2021

(54) HYSTERESIS CONTROL METHOD FOR INVERTER AND AN INVERTER WITH HYSTERESIS CONTROL

(71) Applicant: Delta Electronics (Shanghai) Co., Ltd., Shanghai (CN)

(72) Inventors: Qikang Wei, Shanghai (CN); Feidong Xu, Shanghai (CN); Xuancai Zhu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/718,104

(22) Filed: Dec. 17, 2019

(65) Prior Publication Data
US 2020/0228102 A1 Jul. 16, 2020

(30) Foreign Application Priority Data
Jan. 16, 2019 (CN) .......................... 2019 1 0040236

(51) Int. Cl.
H03K 3/00 (2006.01)
H03K 3/0233 (2006.01)
H02M 7/537 (2006.01)

(52) U.S. Cl.
CPC ........ *H03K 3/02337* (2013.01); *H02M 7/537* (2013.01)

(58) Field of Classification Search
CPC .......................... H03K 3/02337; H02M 7/537
(Continued)

(56) References Cited

U.S. PATENT DOCUMENTS 8,780,592 B1 * 7/2014 Jones ...................... H02M 1/12
363/39
9,843,272 B2 * 12/2017 Tamai ................... H02M 7/487
(Continued)

FOREIGN PATENT DOCUMENTS

CN 103280808 B 5/2015
CN 103684008 B 3/2016
(Continued)

*Primary Examiner* — Ryan Jager
(74) *Attorney, Agent, or Firm* — CKC & Partners Co., LLC (57) ABSTRACT

A hysteresis control method for inverter and an inverter based on hysteresis control are disclosed. The inverter is electrically connected to a power grid, and the method includes: Step S1, sampling a grid voltage $V_g(z)$ and an output current $I_g(z)$ of the inverter; Step S2, calculating a present period hysteresis bandwidth H(z) based on the grid voltage $V_g(z)$ sampled in step S1; Step S3, predicting a next period hysteresis bandwidth H(z+1); Step S4, correcting the present period hysteresis bandwidth H(z) based on the next period hysteresis bandwidth H(z+1) obtained in step S3, to obtain a final hysteresis bandwidth $H_{out}(z)$; and Step S5, controlling an output driving signal according to the output current $I_g(z)$ of the inverter and the final hysteresis bandwidth $H_{out}(z)$ to control the operation of the inverter.

26 Claims, 7 Drawing Sheets

(58) Field of Classification Search
USPC .......................................................... 327/205
See application file for complete search history.

(56) References Cited

U.S. PATENT DOCUMENTS

| | | | | |
|---|---|---|---|---|
| 2014/0112039 | A1* | 4/2014 | Correa Vasquez .... | H02M 7/483 |
| | | | | 363/98 |
| 2014/0169053 | A1* | 6/2014 | Ilic ......................... | H02J 3/387 |
| | | | | 363/132 |
| 2015/0070956 | A1* | 3/2015 | Mu ................... | H02M 7/53871 |
| | | | | 363/132 |
| 2015/0288220 | A1* | 10/2015 | Gurunathan ............ | H02J 1/102 |
| | | | | 307/65 |
| 2018/0145582 | A1* | 5/2018 | Shuai ...................... | H02M 1/32 |

FOREIGN PATENT DOCUMENTS

| | | | |
|---|---|---|---|
| CN | 105871241 A | * | 8/2016 |
| CN | 105871241 A | | 8/2016 |

* cited by examiner

HYSTERESIS CONTROL METHOD FOR INVERTER AND AN INVERTER WITH HYSTERESIS CONTROL

CROSS-REFERENCE TO RELATED APPLICATIONS

This non-provisional application claims priority under 35 U.S.C. § 119(a) on Patent Application No. 2019/10040236.0 filed in P.R. China on Jan. 16, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The invention relates to an inverter and a hysteresis control method for it.

BACKGROUND ART

In order to alleviate serious energy problems, distributed power generation systems with renewable energy are rapidly developed. In order to avoid the impacts of the distributed generation system on the power grid, grid-connected inverters with good performance are required. Wherein, the constant-frequency hysteresis current control is often adopted in the inverters with digital control. Due to the influence of the digital discretization, there will be deviation in the hysteresis bandwidth, especially near the zero crossing point, such that the switching frequency is deviated, the output current of the inverter is distorted, and the harmonic content of the output current is increased, which is difficult for the inverter to meet the grid connection requirements. In addition, the inductance of powder cores varies with the magnitude of the current, which also results in deviation in the bandwidth of the hysteresis control, so the inverter cannot operate with a fixed switching frequency, and additional harmonics is introduced.

For the problem of current distortion near the zero crossing point, the method of duty ratio feedforward or temporarily blocking the driving is usually adopted to improve the waveform quality. However, these methods are not suitable for inverters with hysteresis control. In addition, an intermediate threshold is set between the upper and lower limits of hysteresis control to implement positive, negative, and zero state control, but the method is too complicated.

Therefore, there is an urgent need for the inverter with hysteresis control to solve the problems such as hysteresis bandwidth deviation caused by discretization in the digital control, and the distortion of the output current of the inverter near the zero crossing point.

SUMMARY OF THE INVENTION

In view of the above, it is an object of the present invention to provide a hysteresis control method for an inverter and an inverter with hysteresis control to solve one or more shortcomings in the prior art.

In accordance with an aspect of the present invention, a hysteresis control method for an inverter electrically connected to a power grid is provided. The method comprises:

Step S1, sampling a grid voltage $V_g(z)$ and an output current $I_g(z)$ of the inverter;

Step S2, calculating a present period hysteresis bandwidth $H(z)$ based on the grid voltage $V_g(z)$ sampled in step S1;

Step S3, predicting a next period hysteresis bandwidth $H(z+1)$;

Step S4, correcting the present period hysteresis bandwidth $H(z)$ according to the next period hysteresis bandwidth $H(z+1)$ obtained in step S3 to obtain a final hysteresis bandwidth $H_{out}(z)$;

Step S5, outputting a driving signal according to the output current $I_g(z)$ and the final hysteresis bandwidth $H_{out}(z)$ to control an operation of the inverter.

In accordance with another aspect of the present invention, an inverter with hysteresis control is provided. The inverter comprises a main power circuit having an input and an output, wherein the input is electrically connected to a DC bus, and the output is electrically connected to a power grid;

a control module electrically connected to the main power circuit and configured to control the main power circuit to implement energy conversion from the input to the output, which further includes:

a sampling unit for sampling a grid voltage $V_g(z)$ and an output current $I_g(z)$ of the inverter;

a bandwidth calculation unit configured to calculate a present period hysteresis bandwidth $H(z)$ based on the grid voltage $V_g(z)$;

a bandwidth prediction unit configured to predict a next period hysteresis bandwidth $H(z+1)$;

a correction unit configured to obtain a final hysteresis bandwidth $H_{out}(z)$ by correcting the present period hysteresis bandwidth $H(z)$ based on the next period hysteresis bandwidth $H(z+1)$;

a main control unit configured to output a driving signal according to the output current $I_g(z)$ and the final hysteresis bandwidth $H_{out}(z)$ to control operation of the main power circuit.

The above description will be described in detail in the following embodiments, and further explanations of the technical solutions of the present invention will be provided.

DETAILED DESCRIPTION OF THE PREFERRED EMBODIMENTS

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or similar parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items. In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
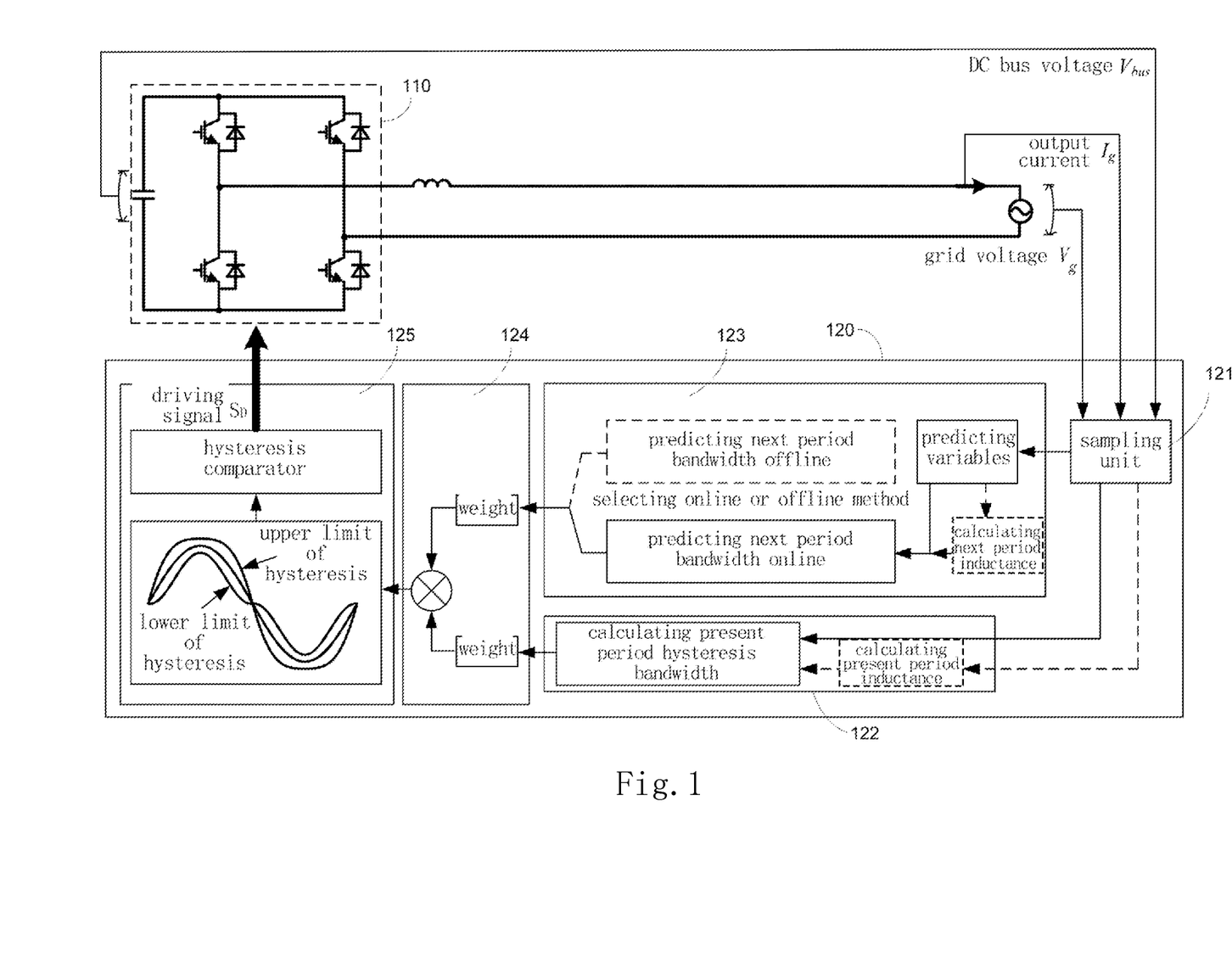
FIG. 1 is a schematic diagram of a system frame for inverter with hysteresis control according to the present disclosure.

FIG. 1 shows schematic diagram of the hysteresis control method for an inverter according to the present disclosure.

The inverter with hysteresis control of the present disclosure includes a main power circuit 110 and a control module 120. The main power circuit 110 has an input and an output, wherein the input is electrically connected to a DC bus, and the output is electrically connected to a power grid. The control module 120 is electrically connected to the main power circuit 110 and is used to control the main power circuit 110 to implement energy conversion from the input to the output.

In an embodiment of the disclosure, the control module 120 includes a sampling unit 121, a bandwidth calculation unit 122, a bandwidth prediction unit 123, a correction unit 124, and a main control unit 125. The sampling unit 121 is configured to sample a grid voltage $V_g(z)$ and an output current $I_g(z)$ of the inverter. The bandwidth calculation unit 122 is configured to calculate a present period hysteresis bandwidth H(z) based on the grid voltage $V_g(z)$. The bandwidth prediction unit 123 is configured to predict a hysteresis next period bandwidth H(z+1). The correcting unit 124 is configured to correct the present period hysteresis bandwidth based on the next period hysteresis bandwidth H(z+1) to obtain a final hysteresis bandwidth $H_{out}(z)$. The main control unit 125 outputs driving signal $S_D$ based on the output current $I_g(z)$ and the final hysteresis bandwidth $H_{out}(z)$ to control the operation of the main power circuit 110. In some embodiments, the main control unit 125 sets a reference current value, and adds and subtracts half of the final hysteresis bandwidth $H_{out}(z)/2$ based on the reference current value to obtain upper and lower limit values of the hysteresis, respectively. The main control unit 125 may further include a hysteresis comparator, which compares the sampled output current $I_g(z)$ with the upper limit and the lower limit of the hysteresis. For example, when the current increases to the upper limit, the driving signal $S_D$ of the corresponding switch tube is turned over, and the switch tube is turned off; when the current is reduced to the lower limit, the driving signal $S_D$ of the corresponding switch tube is turned over, and the switch tube is turned on. Thereby, the main control unit 125 outputs the driving signal $S_D$ to the main power circuit 110 to drive the main power circuit 110 for energy conversion.

Figure 2A:
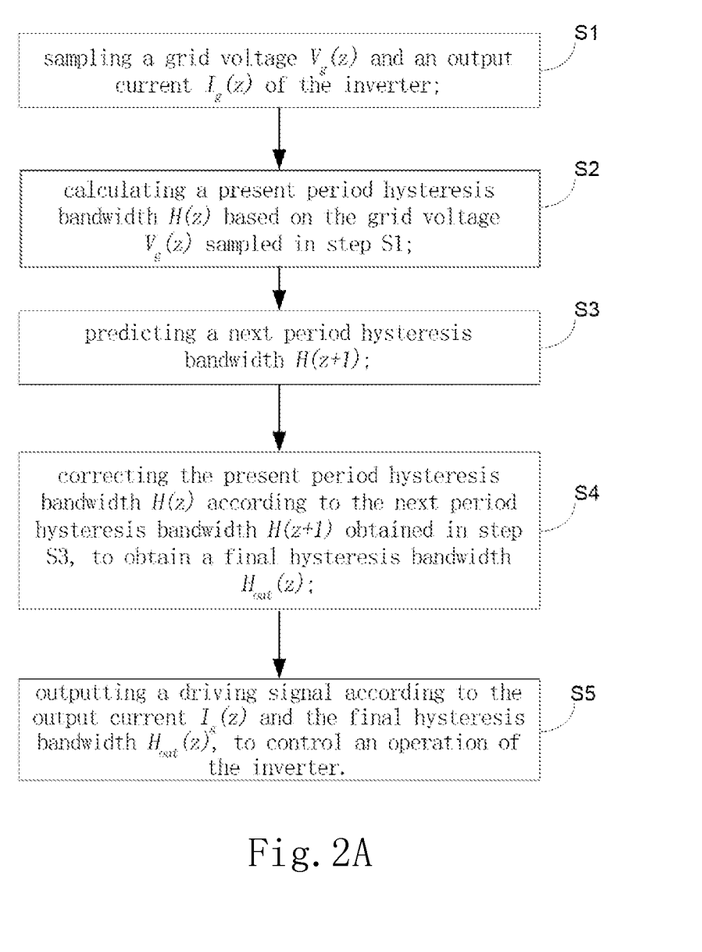
FIG. 2A is a schematic diagram of a hysteresis control method for an inverter according to the present disclosure.

FIG. 2A shows the hysteresis control method for an inverter according to an embodiment of the present disclosure, which includes:

Step S1, sampling a grid voltage $V_g(z)$ and an output current $I_g(z)$ of the inverter; Step S2, calculating a present period hysteresis bandwidth H(z) based on the grid voltage $V_g(z)$ sampled in step S1;

Step S3, predicting the next period hysteresis bandwidth H(z+1);

Step S4, correcting the present period hysteresis bandwidth H(z) according to the next period hysteresis bandwidth H(z+1) obtained in step S3 to obtain the final hysteresis bandwidth $H_{out}(z)$;

Step S5, outputting the driving signal according to the output current $I_g(z)$ and the final hysteresis bandwidth $H_{out}(z)$ to control the operation of the inverter.

It should be noted that, in the present disclosure, the so-called "period" may refer to interruption cycle in a digital control, which may also be a sampling cycle of the inverter, in which operations such as sampling, bandwidth setting, and the like can be completed.

On the other hand, in the present disclosure, the hysteresis bandwidth can be calculated according to a conventional hysteresis bandwidth formula. The calculation formula of the hysteresis bandwidth differs with different topology and control of the inverter and the sequence of actions between the switching devices. In the embodiment shown in FIG. 1, for example, when the main power circuit 110 adopts the bipolar modulation mode, the calculation formula of the hysteresis bandwidth may be $$H = \frac{V_{bus}^2 - V_g^2}{2LV_{bus}f_s} \quad \text{Formula (1)}$$

For example, when the inverter main circuit 110 is in a non-isolated photovoltaic inverter topology, such as H5 or Heric, or a unipolar modulation mode is adopted, the calculation formula of the hysteresis bandwidth may be:

$$H = \frac{V_g(V_{bus} - V_g)}{LV_{bus}f_s} \quad \text{Formula (2)}$$

Wherein, H is the hysteresis bandwidth, L is the inductance of the inverter, $V_g$ is the grid voltage, $V_{bus}$ is the DC bus voltage, and $f_s$ is the switching frequency designed for the inverter. Wherein, if the DC bus is connected with a constant current source, and the DC bus voltage is a fixed value. And if the influence of current on inductance is not considered, the inductance can be a fixed value.

For example, in some embodiments, the present period hysteresis bandwidth H(z) can be calculated:

$$H(z) = \frac{V_g(z)(V_{bus} - V_g(z))}{V_{bus}Lf_s}$$

the next period hysteresis bandwidth H(z+1) can be calculated:

$$H(z+1) = \frac{V_g(z+1)(V_{bus} - V_g(z+1))}{V_{bus}Lf_s}$$

It should be noted that the calculation method of hysteresis bandwidth is not limited to this case, and appropriate hysteresis bandwidth calculation formula can be adopted according to the actual situation of the inverter. In this embodiment, the grid voltage $V_g(z)$ may be measured in real time, and substituted into the above calculation formula to calculate the hysteresis bandwidth H(z) of the present period.

Referring to FIG. 1, in the step S3, the next period hysteresis bandwidth H(z+1) can be obtained with method of online or offline according to an actual application situation. For example, if the requirement for the control accuracy is high, the bandwidth prediction unit 123 can predict the next period grid voltage $V_g(z+1)$ online, and calculate the next period hysteresis bandwidth H(z+1) according to the calculation formula of the hysteresis bandwidth. If the requirement for the control accuracy is low, the next period hysteresis bandwidth H(z+1) can be calculated by the bandwidth prediction unit 123 offline. In some embodiments, for example, near the zero crossing point, the bandwidth prediction unit 123 can directly set the next period hysteresis bandwidth H(z+1)=$H_{zero}$, wherein $H_{zero}$ is the bandwidth value set near the zero crossing point. There are many methods for online prediction, such as using a model predictive control algorithm, establishing a control object model, and then predicting the next period state parameter based on the present system state parameter. Therefore, in this embodiment, the method for online prediction can be used to predict the next period grid voltage $V_g(z+1)$. The offline mode is a method of calculating the theoretical control parameter in advance, wherein all the state parameters of the system are assumed to vary with the theoretical situation. According to the rated operating conditions of the inverter (for example, assuming that the voltage and current of the power grid vary in a sinusoidal mode, the DC bus voltage remains unchanged), and then all theoretical hysteresis bandwidths within a power frequency period are calculated. In some embodiments, for example, the variables required for the next period calculation can be selected from the theoretical hysteresis bandwidth.

In other embodiments of the present disclosure, the DC bus voltage $V_{bus}(z)$ can also be sampled in real time by the sampling unit 121 in step S1. In step S2, the bandwidth calculation unit 122 calculates the present period hysteresis bandwidth H(z) based on the grid voltage $V_g(z)$ and the DC bus voltage $V_{bus}(z)$ sampled in step S1. In step S3, the bandwidth prediction unit 123 predicts the next period grid voltage $V_g(z+1)$ and the next period DC bus voltage $V_{bus}(z+1)$ online, and calculates the next period hysteresis bandwidth H(z+1) based on the next period grid voltage $V_g(z+1)$ and the next period DC bus voltage $V_{bus}(z+1)$. Alternatively, the bandwidth prediction unit 123 can obtain the next period grid voltage $V_g(z+1)$ and the next period DC bus voltage $V_{bus}(z+1)$ offline, thereby calculating the next period hysteresis bandwidth H(z+1), wherein the calculation formula of the hysteresis bandwidth can also adopt the above Formula (1) or Formula (2), which will not be described in detail herein.

For example, the present period hysteresis bandwidth H(z) can be calculated:

$$H(z) = \frac{V_g(z)(V_{bus}(z) - V_g(z))}{V_{bus}(z)Lf_s}$$

the next period hysteresis bandwidth H(z+1) can be calculated:

$$H(z+1) = \frac{V_g(z+1)(V_{bus}(z+1) - V_g(z+1))}{V_{bus}(z+1)Lf_s}$$

In step S4, the correcting unit 124 may modify the present period hysteresis bandwidth H(z) by weighted average method. For example, the final hysteresis bandwidth $H_{out}(z)$ may be calculated based on the present period hysteresis bandwidth H(z) and the next period hysteresis bandwidth H(z+1). For example, the corrected formula of the final hysteresis bandwidth can be:

$$H_{out}(z)A(z)H(z)+B(z)H(z+1),$$

wherein, $H_{out}(z)$ is the final hysteresis bandwidth of the present period, A(z) and B(z) are weight coefficients.

In some embodiments, the relationship between the weight coefficients of A(z) and B(z) can be B(z)=1−A(z). Further, in some embodiments, weight coefficients can be A(z)=B(z)=0.5. It should be understood that the values of the weight coefficients are not limited to the above values, which are not intended to limit the disclosure. The present disclosure can reduce the influence of discretization in digital control by taking the weighted average of the present period hysteresis bandwidth and the next period hysteresis bandwidth as the final hysteresis bandwidth.

In the above embodiments, the inductance of the inverter in the calculation formula of the hysteresis bandwidth may be a fixed inductance. In other embodiments, the inductance of the inverter in the calculation formula for the hysteresis bandwidth may be a varying inductance. Especially when the inductance of the inverter is not ideal, for example, when the inductance of the inductor formed by some materials (for example, the magnetic powder core) is affected greatly by current, the inductance of the inverter can be taken into consideration further to make the designed bandwidth more accurate.

When the influence of the vary of the inductance of the inverter cannot be ignored, it is necessary to calculate the inductance before calculating the present period hysteresis bandwidth and the next period hysteresis bandwidth.

For example, before Step S2 the method further includes:

step S20, wherein the bandwidth calculation unit 122 obtains the real time inductance L(z) of the inverter based on the output current $I_g(z)$ of the present period by the methods of looking up table or fitting curve. The method of looking up table is to search from a table containing different output current values of the inverter and corresponding inductances to obtain the real time inductance L(z) of the inverter corresponding to the output current $I_g(z)$ of the present period.

Correspondingly, before Step S3, the method includes:

step S30, wherein the bandwidth prediction unit 123 further predicts the next period output current $I_g(z+1)$ of the inverter, and obtains the next period inductance L(z+1) of the inverter by the looking up table method or the fitting curve method.

Figure 2B:
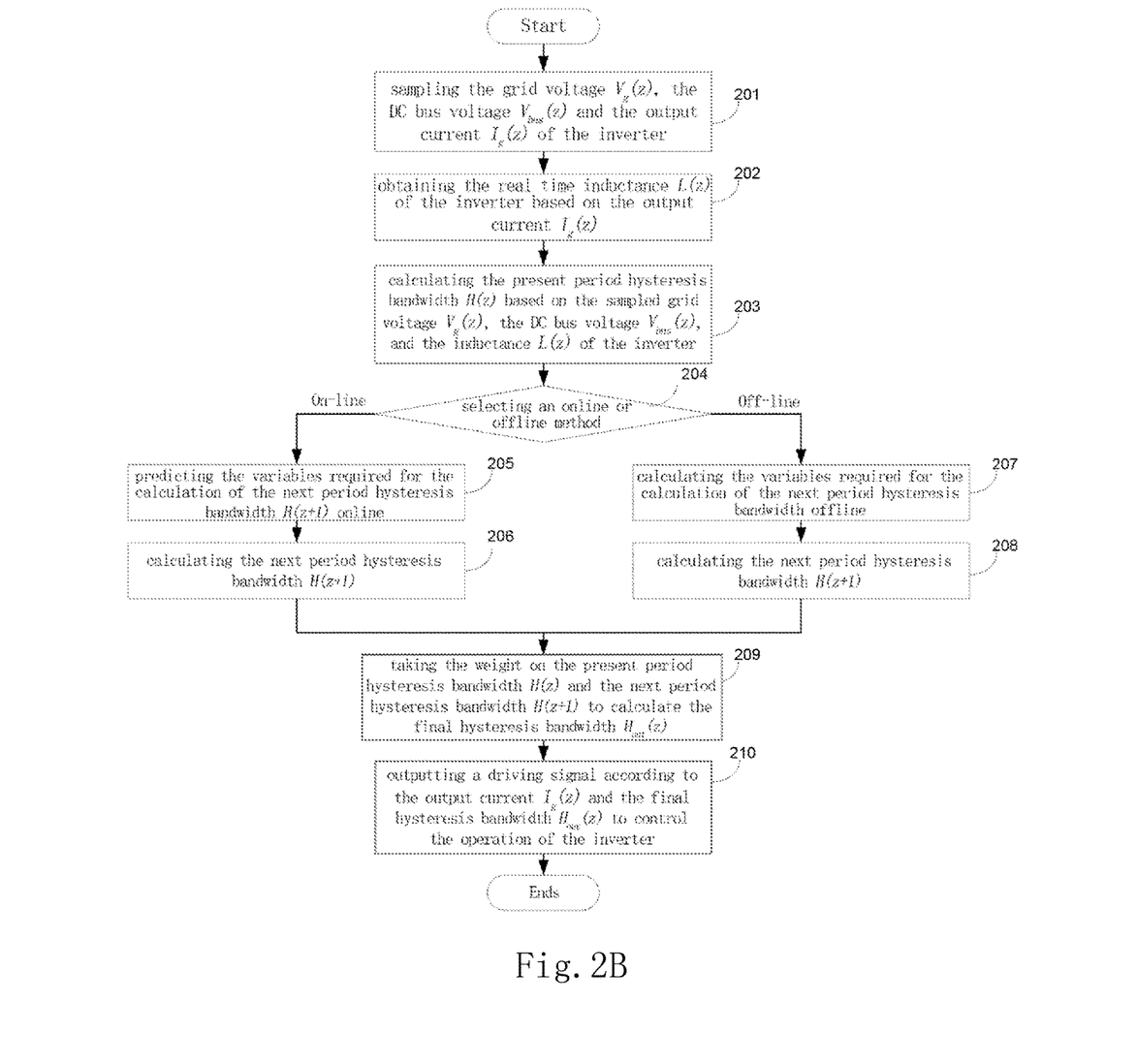
FIG. 2B is a schematic diagram of a hysteresis control method according to an embodiment of the present disclosure.

The hysteresis control method for the inverter of the present disclosure will be further described in detail below with reference to FIG. 1 and FIG. 2B in an embodiment. In this embodiment, the influence of discretization in the digital control and the influence of the inductance of the inverter are comprehensively considered. As shown in FIG. 2B, the hysteresis control method for the inverter of this embodiment includes:

Step 201: sampling the grid voltage $V_g(z)$, the DC bus voltage $V_{bus}(z)$ and the output current $I_g(z)$ of the inverter;

Step 202: obtaining the real time inductance L(z) of the inverter based on the output current $I_g(z)$.

Figure 3:
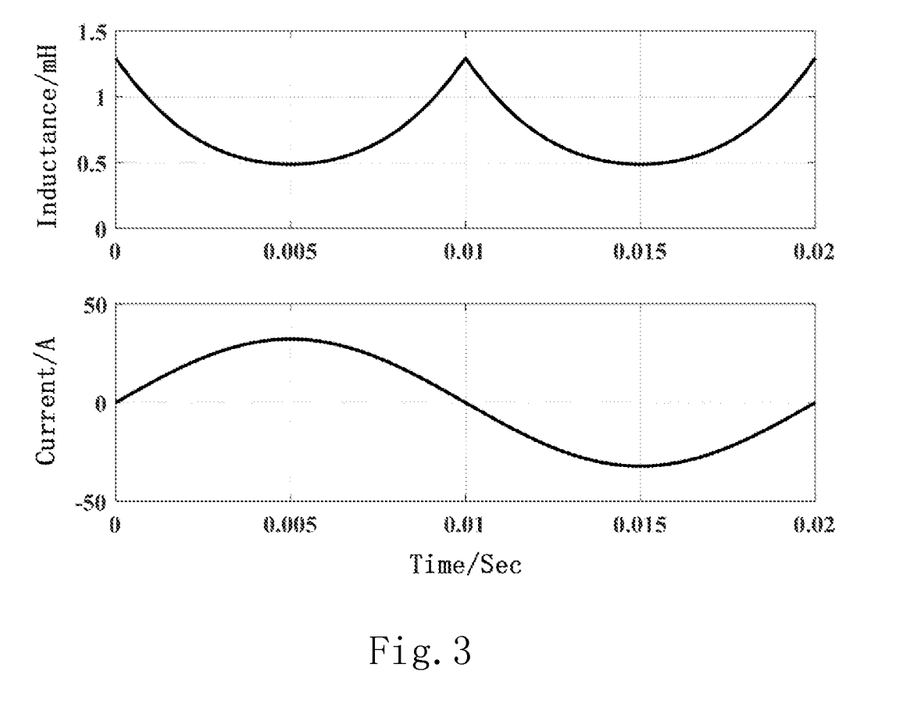
FIG. 3 is a diagram showing a relationship between the magnetic powder core inductance used in the inverter of embodiment of FIG. 2B and the current.
Figure 4:
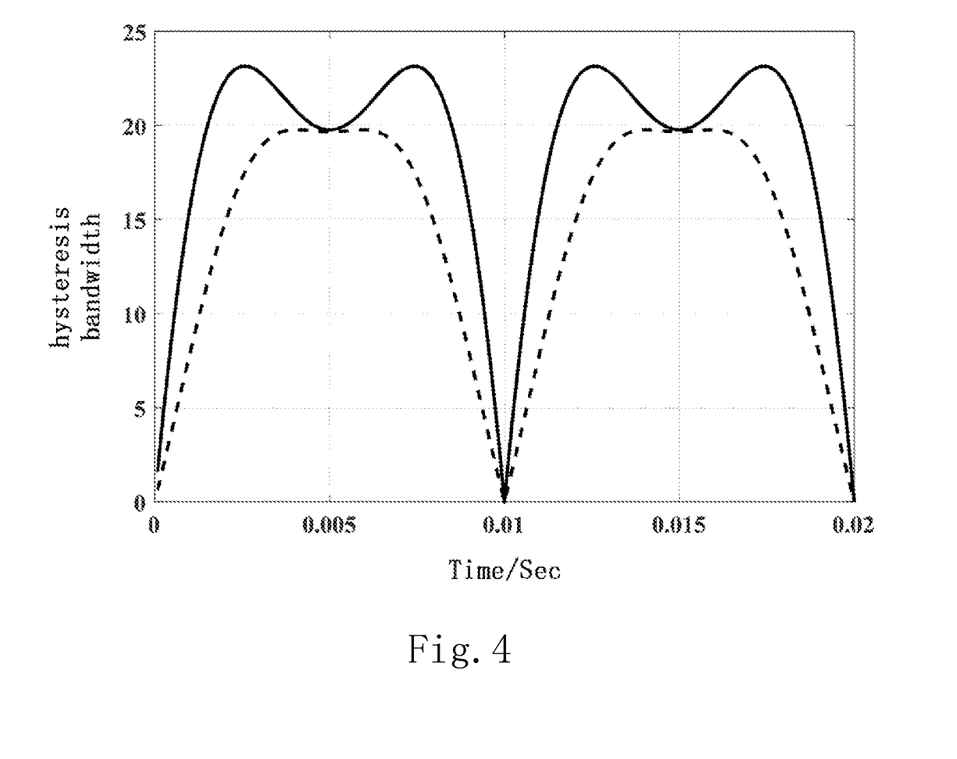
FIG. 4 shows the hysteresis bandwidth with different inductances in the present invention, wherein the solid line shows waveform under a fixed inductance, and the broken line shows waveform under a changed inductance with the current (i.e., a varying inductance)

In this step, for example, the looking up table method or the fitting curve method above-described can be used to obtain the inductance according to the characteristics of the magnetic core of filter inductor of the inverter. FIG. 3 is a diagram showing relationship between the magnetic powder core inductance used in the inverter of embodiment of FIG. 2B and the current. It can be seen from FIG. 3 that the larger the current value, the smaller the inductance. FIG. 4 shows the theoretical bandwidth values with different inductances, wherein the solid line shows waveform under a fixed inductance, and the dashed line shows waveform under a varying inductance changed with the current. It can be seen from FIG. 4 that there is a significant deviation between the two results, thereby a more accurate hysteresis bandwidth can be obtained by considering the variation of the inductance during the design of the hysteresis bandwidth.

Step 203: calculating the present period hysteresis bandwidth H(z) based on the sampled grid voltage $V_g(z)$, the DC bus voltage $V_{bus}(z)$, and the inductance L(z) of the inverter.

In this step, the bandwidth calculation formula employed in the present embodiment is, for example, the Formula (1) or the Formula (2).

For example, the present period hysteresis bandwidth H(z) can be calculated:

$$H(z) = \frac{V_g(z)(V_{bus}(z) - V_g(z))}{V_{bus}(z)Lf_s}$$

Step 204: according to the actual needs, selecting an online or offline method to obtain the next period hysteresis bandwidth H(z+1). If an online method is selected, then steps 205 and 206 are performed; if an offline method is selected, then steps 207 and 208 are performed.

Step 205: predicting the variables required for the calculation of the next period hysteresis bandwidth H(z+1) online. The variables include, for example, the next period grid voltage $V_g(z+1)$, the next period DC bus voltage $V_{bus}(z+1)$, the next period inductance L(z+1), and etc. These variables can be obtained using existing prediction methods.

Step 206: calculating the next period hysteresis bandwidth H(z+1). In this step, the bandwidth calculation formula of the next period corresponds to the calculation formula employed in step 203.

For example, the next period hysteresis bandwidth H(z+1) can be calculated:

$$H(z+1) = \frac{V_g(z+1)(V_{bus}(z+1) - V_g(z+1))}{V_{bus}(z+1)L(z+1)f_s}$$

If an offline method is used to calculate the next period hysteresis bandwidth, then the following steps are performed:

Step 207: calculating the variables required for the calculation of the next period hysteresis bandwidth offline. The variables include, for example, the next period grid voltage $V_g(z+1)$, the next period DC bus voltage $V_{bus}(z+1)$, the next period inductance L(z+1) and etc.

In this step, in the present embodiment, according to the rated working condition of the inverter, it is assumed that all the state parameters of the system vary with the theoretical condition. For example, the grid voltage and current of vary in an ideal sinusoidal mode, and the DC bus voltage remains unchanged. The variables required for the next period calculation are obtained therefrom.

Step 208: calculating the next period hysteresis bandwidth H(z+1) based on the variables calculated in step 207.

Similarly, the calculation formula used to calculate the hysteresis bandwidth in this step is corresponding to the calculation formula used in step 203. Simplified methods can also be used in engineering applications, such as giving a bandwidth directly near the zero crossing and setting $H(z) = H(z+1) = H_{zero}$, wherein $H_{zero}$ is a preset bandwidth value near the zero crossing.

Step 209: taking the weight on the present period hysteresis bandwidth H(z) and the next period hysteresis bandwidth H(z+1) to calculate the final hysteresis bandwidth $H_{out}(z)$. For example, the present period hysteresis bandwidth H(z) obtained in step 203 is weighted with the next period bandwidth H(z+1) calculated in step 206 or step 208. The calculation formula is $$H_{out}(z) A(z)H(z) + B(z)H(z+1),$$

wherein, $H_{out}(z)$ is the final hysteresis bandwidth of the present period, A(z) and B(z) are weight coefficients. The greater the weight coefficient, the greater the effect of the corresponding bandwidth design. In this specific embodiment it is selected that A(z)=B(z)=0.5.

Step 210: outputting a driving signal according to the output current $I_g(z)$ and the final hysteresis bandwidth $H_{out}(z)$ to control the operation of the inverter.

Wherein, the main control unit sets a reference current value, respectively adds and subtracts half of the final hysteresis bandwidth $H_{out}(z)/2$, thereby calculating an upper limit of the hysteresis and a lower limit of the hysteresis, and compares the output current with the upper and lower limits of the hysteresis to finally output the driving signal to control the operation of the inverter.

Figure 5:
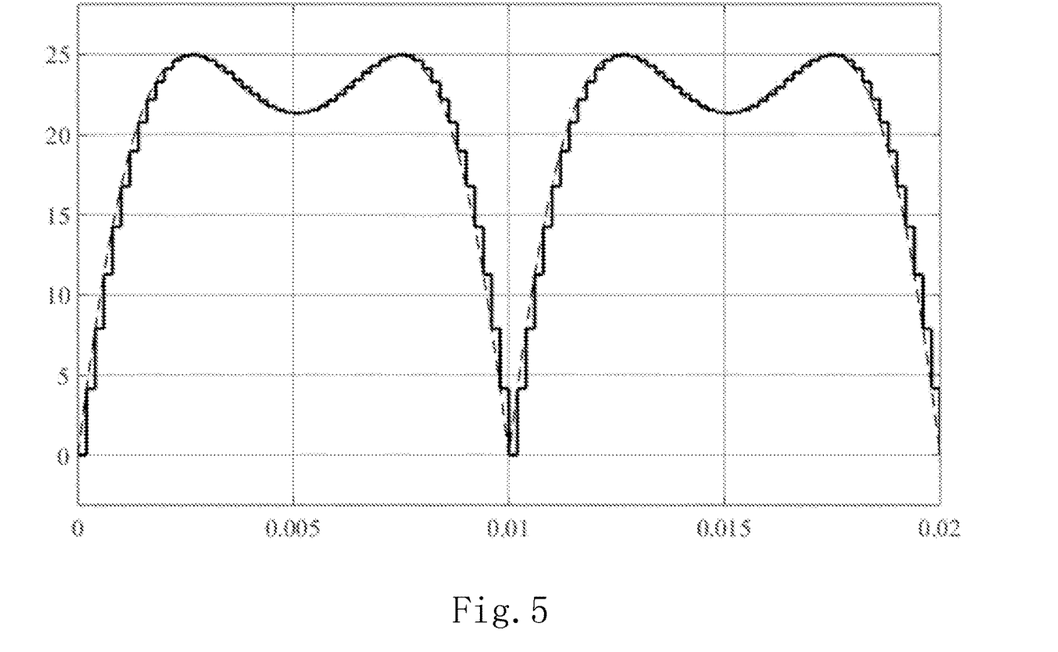
FIG. 5 shows the waveforms of the theoretical hysteresis bandwidth calculated according to the bandwidth calculation formula and the actually discretized hysteresis bandwidth before the bandwidth correction.
Figure 6:
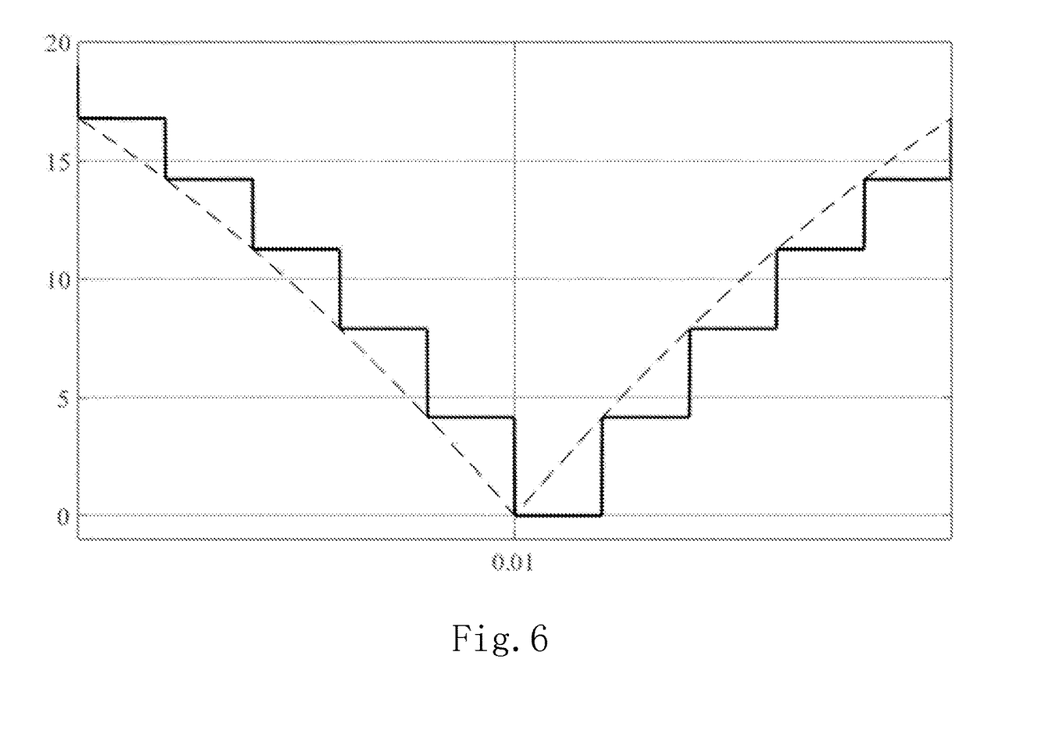
FIG. 6 is an enlarged view of waveform diagram near 0.01 s in FIG. 5.
Figure 7:
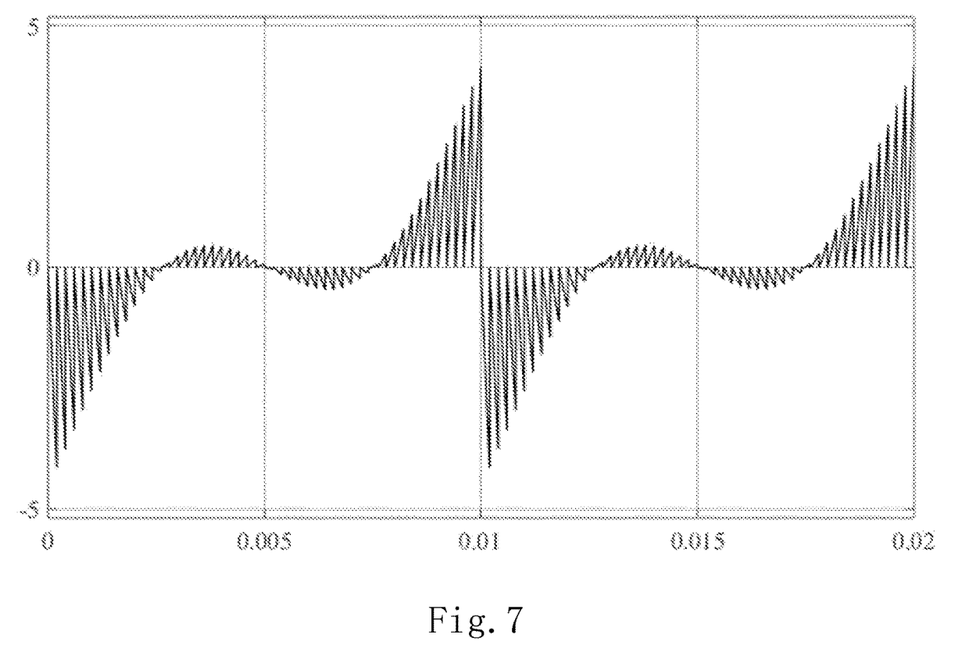
FIG. 7 shows the deviation between the discretized hysteresis bandwidth and the theoretical hysteresis bandwidth in one period of FIG. 5.
Figure 8:
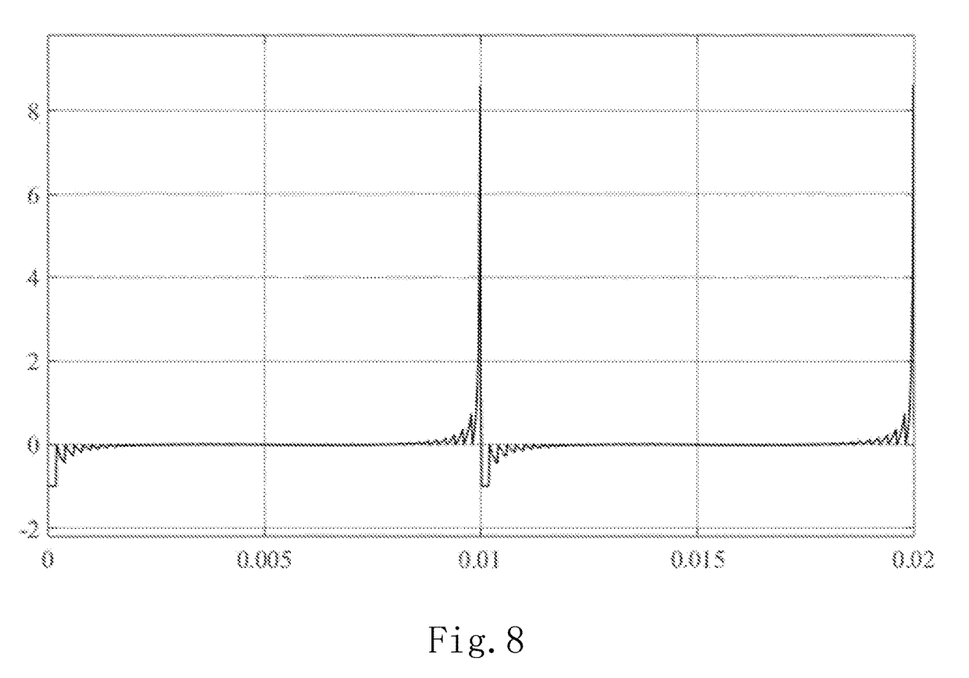
FIG. 8 shows the deviations of the actual hysteresis bandwidth and the theoretical hysteresis bandwidth in FIG. 5 from the theoretical hysteresis bandwidth.

FIG. 5 shows the waveforms of the theoretical hysteresis bandwidth calculated according to a bandwidth calculation formula and the actually discretized hysteresis bandwidth before the bandwidth correction, wherein the dashed line shows the theoretical values and the solid line shows the discretized bandwidth in the digital control. FIG. 6 is an enlarged view of waveform diagram near 0.01 s in FIG. 5, in which there is a significant deviation between the solid line and the broken line, which means discretized bandwidth are not equal to theoretical values. FIG. 7 shows the deviation between the discretized bandwidth and the theoretical bandwidth in one power frequency period, and it can be clearly seen that the deviation is largest near the zero crossing point. FIG. 8 shows the proportion of the deviation in the theoretical bandwidth. According to FIG. 8, the digital discretization results in a very large deviation near the zero crossing point, which will cause severe distortion of the current.

Figure 9:
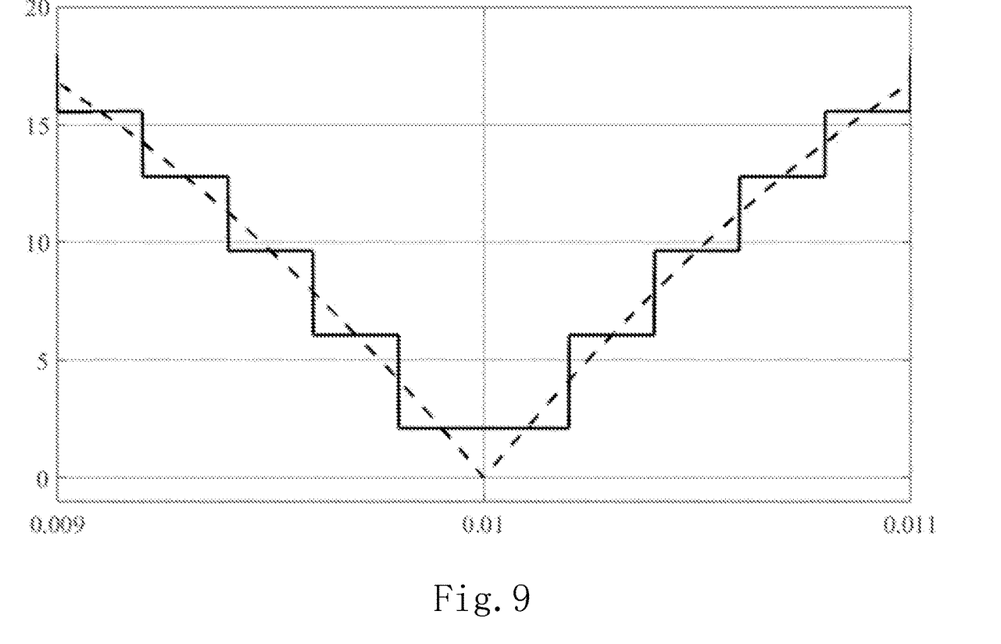
FIG. 9 is an enlarged view of diagram of a hysteresis bandwidth near the zero crossing point according to an embodiment of the present disclosure.

FIG. 9 is an enlarged view of diagram showing the result of the bandwidth calculation of the present embodiment near the zero crossing point. Comparing FIG. 9 with FIG. 6, it can be seen that the discretization deviation is corrected.

Figure 10:
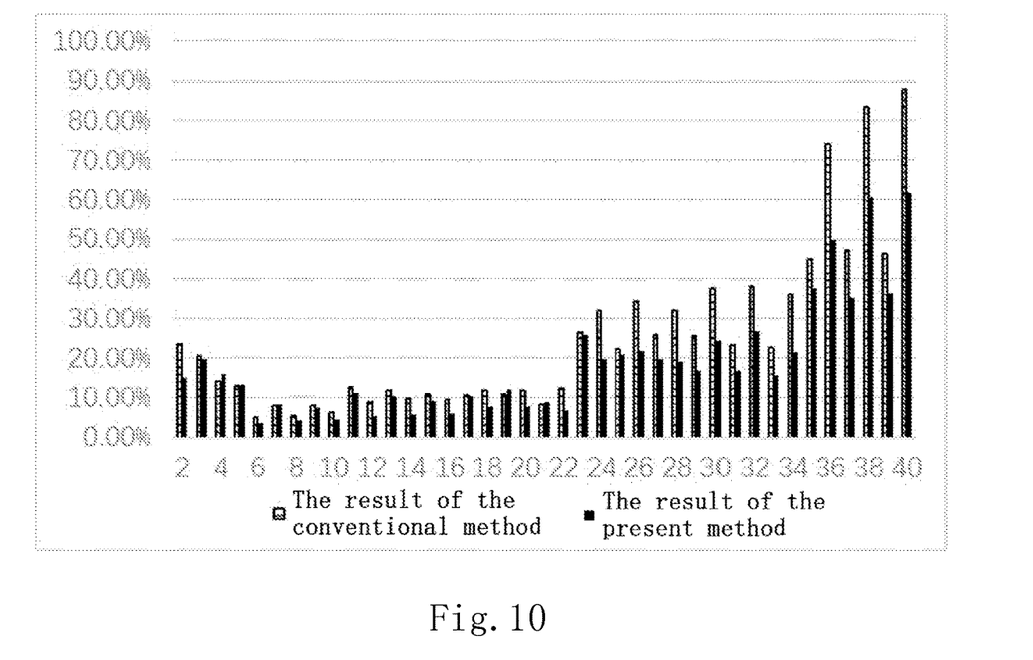
FIG. 10 is a schematic diagram showing the experimental results of current total harmonic distortion (THD) obtained by hysteresis control using the method of the present invention and a conventional method.

FIG. 10 is a schematic diagram showing experimental results of current Total Harmonic Distortion (THD) obtained by hysteresis control using the method of the present disclosure and a conventional method, wherein white stripe blocks represent experimental results by a conventional hysteresis control method, and black squares represent the experimental results by the hysteresis control method of the present disclosure. It can be seen from the figure that the high frequency harmonics in the experimental results of the present disclosure are significantly smaller than in the conventional method. The present disclosure corrects the present period hysteresis bandwidth by the next period hysteresis bandwidth which is predicted, thereby effectively reducing the bandwidth deviation of the power grid voltage near the zero crossing point, and effectively reducing the current high harmonic content. Further, the method of the present disclosure takes variations of actual inductances into account, thereby further optimizing hysteresis control of the inverter.

The present disclosure has been disclosed in the above embodiments, and is not intended to limit the present disclosure, and the present disclosure can be variously modified and qualified without departing from the spirit and scope of the present disclosure. The scope of protection is subject to the scope defined by the appended claims.

What is claimed is:

1. A hysteresis control method for an inverter electrically connected to a power grid, comprising:
Step S1, sampling a grid voltage $V_g(z)$ and an output current $I_g(z)$ of the inverter;
Step S2, calculating a present period hysteresis bandwidth $H(z)$ based on the grid voltage $V_g(z)$ sampled in step S1;
Step S3, predicting a next period hysteresis bandwidth $H(z+1)$;
Step S4, correcting the present period hysteresis bandwidth $H(z)$ according to the next period hysteresis bandwidth $H(z+1)$ obtained in step S3, to obtain a final hysteresis bandwidth $H_{out}(z)$;
Step S5, outputting a driving signal according to the output current $I_g(z)$ and the final hysteresis bandwidth $H_{out}(z)$, to control an operation of the inverter.

2. The hysteresis control method according to claim 1, wherein the Step 3 further comprising:
predicting a next period grid voltage $V_g(z+1)$ online, and calculating the next period hysteresis bandwidth $H(z+1)$ based on the next period grid voltage $V_g(z+1)$.

3. The hysteresis control method according to claim 1, wherein the Step 3 further comprising:
calculating the next period hysteresis bandwidth $H(z+1)$ offline.

4. The hysteresis control method according to claim 3, further comprising:
setting the next period hysteresis bandwidth $H(z+1)=H_{zero}$ directly near zero crossing point in Step S3, wherein $H_{zero}$ is an bandwidth value set near the zero crossing point.

5. The hysteresis control method according to claim 1, wherein in step S4, a correction formula of the final hysteresis bandwidth is:

$$H_{out}(z)=A(z)H(z)+B(z)H(z+1),$$

wherein, $H_{out}(z)$ is the final hysteresis bandwidth of the present period, and $A(z)$ and $B(z)$ are weight coefficients.

6. The hysteresis control method according to claim 5, wherein a relationship between the weight coefficients $A(z)$ and $B(z)$ is: $B(z)=1-A(z)$.

7. The hysteresis control method according to claim 6, wherein the weight coefficients $A(z)=B(z)=0.5$.

8. The hysteresis control method according to claim 5, wherein the formulas for calculating the hysteresis bandwidth are:

$$H = \frac{V_{bus}^2 - V_g^2}{2LV_{bus}f_s}, \text{ or } H = \frac{V_g(V_{bus} - V_g)}{LV_{bus}f_s}$$

wherein, H is the hysteresis bandwidth, L is inductance of the inverter, $V_g$ is the grid voltage, $V_{bus}$ is DC bus voltage, and $f_s$ is a switching frequency designed for the inverter.

9. The hysteresis control method according to claim 8, wherein the inductance of the inverter in the calculation formula of the hysteresis bandwidth is a fixed inductance.

10. The hysteresis control method according to claim 8, wherein the inductance of the inverter in the calculation formula of the hysteresis bandwidth is a varying inductance.

11. The hysteresis control method according to claim 10, further including the following before Step S2:
Step S20, obtaining a real time inductance $L(z)$ of the inverter by method of looking up table or fitting curve based on the output current $I_g(z)$ of the present period, wherein the method of looking up table is to search from a table containing different output current values of the inverter and corresponding inductances to obtain the real time inductance $L(z)$ of the inverter corresponding to the output current $I_g(z)$ of the present period.

12. The hysteresis control method according to claim 11, further including Step S30 before Step S3:
  predicting a next period output current $I_g(z+1)$ of the inverter, and obtaining a next period inductance $L(z+1)$ of the inverter by using look-up table method or fitting curve method.

13. The hysteresis control method according to claim 8, further comprising:
  sampling a DC bus voltage $V_{bus}(z)$ in step S1;
  calculating the present period hysteresis bandwidth H(z) in step S2 based on the grid voltage $V_g(z)$ and the sampled DC bus voltage $V_{bus}(z)$ ins step S1;
  predicting a next period grid voltage $V_g(z+1)$ and a next period DC bus voltage $V_{bus}(z+1)$ of the online, and calculating the next period hysteresis bandwidth H(z+1) in Step S3 based on the next period grid voltage $V_g(z+1)$ the and the next period DC bus voltage $V_{bus}(z+1)$.

14. An inverter with hysteresis control, wherein the inverter comprises:
  an main power circuit with an input and an output, wherein the input is electrically connected to a DC bus, and the output is electrically connected to a power grid;
  a control module electrically connected to the main power circuit and configured to control the main power circuit to implement energy conversion from the input to the output, wherein the control module further comprises:
  a sampling unit configured to sample a grid voltage $V_g(z)$ and an output current $I_g(z)$ of the inverter;
  a bandwidth calculation unit configured to calculate a present period hysteresis bandwidth H(z) based on the grid voltage $V_g(z)$;
  a bandwidth prediction unit configured to predict a next period hysteresis bandwidth H(z+1);
  a correction unit configured to obtain a final hysteresis bandwidth $H_{out}(z)$ by correcting the present period hysteresis bandwidth H(z) based on the next period hysteresis bandwidth H(z+1);
  a main control unit configured to output a driving signal according to the output current $I_g(z)$ and the final hysteresis bandwidth $H_{out}(z)$ to control operation of the main power circuit.

15. The inverter with hysteresis control according to claim 14, wherein the bandwidth prediction unit predicts a next period grid voltage $V_g(z+1)$ online, and calculates the next period hysteresis bandwidth H(z+1) based on the next period grid voltage $V_g(z+1)$.

16. The inverter with hysteresis control according to claim 14, wherein the bandwidth prediction unit calculates the next period hysteresis bandwidth H(z+1) offline.

17. The inverter with hysteresis control according to claim 16, wherein the bandwidth prediction unit directly sets the next period hysteresis bandwidth $H(z+1)=H_{zero}$ near zero crossing point, wherein $H_{zero}$ is the bandwidth value set near the zero crossing point.

18. The inverter with hysteresis control according to claim 14, wherein the correction unit calculates the final hysteresis bandwidth $H_{out}(z)$ based on the present period hysteresis bandwidth H(z) and the next period hysteresis bandwidth H(z+1), with a correction formula of the final hysteresis $$H_{out}(z)=A(z)H(z)+B(z)H(z+1),$$

wherein, $H_{out}(z)$ is the final hysteresis bandwidth of present period, and A(z) and B(z) are weight coefficients.

19. The inverter with hysteresis control according to claim 18, wherein a relationship between the weight coefficients is: A(z) and B(z) is B(z)=1−A(z).

20. The inverter with hysteresis control according to claim 19, wherein the weight coefficients (z)=B(z)=0.5.

21. The inverter with hysteresis control according to claim 18, wherein the formulas for calculating the hysteresis bandwidth in the bandwidth calculation unit and the bandwidth prediction unit are:

$$H = \frac{V_{bus}^2 - V_g^2}{2LV_{bus}f_s}, \text{ or } H = \frac{V_g(V_{bus} - V_g)}{LV_{bus}f_s}$$

wherein, H is the hysteresis bandwidth, L is an inductance of the inverter, $V_g$ is the grid voltage, $V_{bus}$ is a DC bus voltage, and $f_s$ is a switching frequency designed for the inverter.

22. The inverter with hysteresis control according to claim 21, wherein the inductance which is used by the bandwidth calculation unit and the bandwidth prediction unit for calculating the hysteresis bandwidth is a fixed value.

23. The inverter with hysteresis control according to claim 21, wherein the inductance which is used by the bandwidth calculation unit and the bandwidth prediction unit for calculating the hysteresis bandwidth is a varying value.

24. The inverter with hysteresis control according to claim 23, wherein the bandwidth calculation unit obtains a real time inductance L(z) of the inverter by method of looking up table or fitting curve based on the output current $I_g(z)$ of the present period, wherein the method of looking up table is to search from a table containing different output current values of the inverter and corresponding inductances to obtain the real time inductance L(z) of the inverter corresponding to the output current $I_g(z)$ of the present period.

25. The inverter with hysteresis control according to claim 24, wherein the bandwidth prediction unit further predicts a next period output current $I_g(z+1)$ of the inverter, and uses the method of looking up table or the fitting curve to obtain a next period inductance L(z+1) of the inverter.

26. The inverter with hysteresis control according to claim 21, wherein the sampling unit further samples the DC bus voltage $V_{bus}(z)$; and,
  the bandwidth calculation unit further calculates the present period hysteresis bandwidth H(z) based on the grid voltage $V_g(z)$ and the sampled DC bus voltage $V_{bus}(z)$;
  the bandwidth prediction unit further predicts a next period grid voltage $V_g(z+1)$ and a next period DC bus voltage $V_{bus}(z+1)$ online, and calculates the next period hysteresis bandwidth H(z+1) based on the next period grid voltage $V_g(z+1)$ and the next period DC bus voltage $V_{bus}(z+1)$.

* * * * *